(12) United States Patent
Qing et al.

(10) Patent No.: US 9,887,013 B2
(45) Date of Patent: Feb. 6, 2018

(54) SHIFT REGISTER UNIT, SHIFT REGISTER, AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Haigang Qing, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 138 days.

(21) Appl. No.: 14/423,252

(22) PCT Filed: Aug. 16, 2013

(86) PCT No.: PCT/CN2013/081660
§ 371 (c)(1),
(2) Date: Feb. 23, 2015

(87) PCT Pub. No.: WO2014/180074
PCT Pub. Date: Nov. 13, 2014

(65) Prior Publication Data
US 2015/0228353 A1    Aug. 13, 2015

(30) Foreign Application Priority Data

May 7, 2013 (CN) .......................... 2013 1 0163879

(51) Int. Cl.
*G11C 19/00* (2006.01)
*G11C 19/28* (2006.01)
(Continued)

(52) U.S. Cl.
CPC ............... *G11C 19/28* (2013.01); *G09G 3/20* (2013.01); *G09G 3/3677* (2013.01); *G09G 2310/0286* (2013.01)

(58) Field of Classification Search
None
See application file for complete search history.

(56) References Cited

U.S. PATENT DOCUMENTS 5,859,630 A * 1/1999 Huq .................... G09G 3/3677
345/100
6,345,085 B1    2/2002 Yeo et al.
(Continued)

FOREIGN PATENT DOCUMENTS

CN    101877202 A    11/2010
CN    102682692 A    9/2012
CN    202771779 U    3/2013

OTHER PUBLICATIONS

International Preliminary Report on Patentability Appln. No. PCT/CN2013/081660; dated Nov. 10, 2015.

*Primary Examiner* — Tuan T Lam
(74) *Attorney, Agent, or Firm* — Ladas & Parry LLP

(57) ABSTRACT

A shift register unit, a shift register and a display apparatus. The shift register unit comprises a driving signal input terminal (OUT(n-1)), a driving signal output terminal (OUT(n)), a first clock signal input terminal (CK), a second clock signal input terminal (CKB), a driving transistor (T1) and an output pull-down transistor (T2), wherein the gate of the output pull-down transistor (T2) is connected to the second clock signal input terminal (CKB), the low level input by the driving signal input terminal (OUT(n-1)) is a first low level (VGL1), the source of the output pull-down transistor (T2) is connected to a first low level (VGL1) output terminal, the low levels input by the first clock signal input terminal (CK) and the second clock signal input terminal (CKB) both are (Continued)

a second low level (VGL2), and the difference between the first low level (VGL1) and the second low level (VGL2) is larger than the absolute value of the critical voltage of the output pull-down transistor (T2) such that the pull-down transistor (T2) can be turned off during an evaluation phase. The shift register unit can use depletion TFTs.

9 Claims, 3 Drawing Sheets

(51) Int. Cl.
*G09G 3/20* (2006.01)
*G09G 3/36* (2006.01)

(56) References Cited

U.S. PATENT DOCUMENTS

| | | | | |
|---|---|---|---|---|
| 6,788,757 B1 * | 9/2004 | Lu | ............................ | G11C 19/28 377/69 |
| 7,310,402 B2 * | 12/2007 | Wei | ........................ | G11C 19/28 377/64 |
| 7,317,780 B2 * | 1/2008 | Lin | ........................ | G09G 3/3648 326/93 |
| 7,848,477 B2 * | 12/2010 | Cheng | ..................... | G11C 19/28 377/64 |
| 8,218,713 B2 * | 7/2012 | Hsu | ........................ | G11C 19/28 377/64 |
| 8,565,370 B2 * | 10/2013 | Lee | ........................ | G09G 3/3677 377/64 |
| 8,605,027 B2 * | 12/2013 | Pak | ........................ | G09G 3/3677 315/169.2 |
| 2008/0101529 A1 * | 5/2008 | Tobita | ................... | G09G 3/3677 377/64 |
| 2010/0226473 A1 * | 9/2010 | Liu | ........................ | G11C 19/28 377/79 |
| 2011/0228891 A1 * | 9/2011 | Yang | ...................... | G11C 19/28 377/75 |
| 2012/0170707 A1 * | 7/2012 | Hsu | ....................... | G09G 3/3677 377/79 |
| 2015/0294733 A1 * | 10/2015 | Tan | ........................ | G11C 19/28 345/204 |

* cited by examiner

SHIFT REGISTER UNIT, SHIFT REGISTER, AND DISPLAY APPARATUS

TECHNICAL FIELD OF THE DISCLOSURE

The present disclosure relates to the field of organic light emitting display, and in the shift register.

BACKGROUND

With the development of the flat panel display, high resolution and narrow frame become a trend of the development. Integration of gate driving circuits on the display panel is the most important solution to realize high resolution and narrow frame.

SUMMARY

Embodiments of the present disclosure provide a shift register unit, a shift register comprising such a shift register unit, and a display apparatus comprising such a shift register. The shift register unit can use depletion TFTs.

In order to solve the drawbacks of the known solutions, as one aspect of embodiments of the present disclosure, there is provided a shift register unit. The shift register unit comprises a driving signal input terminal, a driving signal output terminal, a first clock signal input terminal, a second clock signal input terminal, a driving transistor and an output pull-down transistor, wherein the gate of the output pull-down transistor is connected to the second clock signal input terminal, the low level input by the driving signal input terminal is a first low level, the source of the output pull-down transistor is connected to a first low level output terminal, the low levels input by the first clock signal input terminal and the second clock signal input terminal both are a second low level, and the difference between the first low level and the second low level is larger than the absolute value of the critical voltage of the output pull-down transistor such that the pull-down transistor can be turned off during an evaluation phase.

Optionally, the gate of the driving transistor forms a pull-up node, the shift register unit further comprises a switch unit connected to the pull-up node, the switch unit can connect the pull-up node with the driving signal input terminal during a pre-charging phase to charge a capacitor connected to the driving transistor in parallel, and the switch unit can disconnect the pull-up node from the driving signal input terminal during the evaluation phase to prevent the pull-up node from leaking electricity.

Optionally, the switch unit comprises a first switch transistor and a second switch transistor, the gate of the first switch transistor is connected to the second clock signal input terminal, the drain of the first switch transistor is connected to the driving signal input terminal, the source of the first switch transistor is connected to the drain of the second switch transistor, the gate of the second switch transistor is connected to the driving signal input terminal, and the source of the second switch transistor is connected to the pull-up node.

Optionally, the shift register unit comprises a pull-down unit and a pull-down transistor, the gate of the pull-down transistor is connected to the pull-down unit, the source of the pull-down transistor is connected to a second low level output terminal, and the pull-down unit can turn off the pull-down transistor during the evaluation phase and turn on the pull-down transistor during a reset phase and a non-operation phase such that the pull-down transistor can pull down the level of the pull-up node to the second low level during the reset phase and the non-operation phase.

Optionally, the pull-down unit comprises a first pull-down control transistor and a second pull-down control transistor, the gate of the first pull-down control transistor is connected to the pull-up node, the source of the first pull-down control transistor is connected to a third low level output terminal, the drain of the first pull-down control transistor is connected to the gate of the pull-down transistor, the gate of the second pull-down control transistor is connected to the second clock signal input terminal, the drain of the second pull-down control transistor is connected to a high level output terminal, the source of the second pull-down control transistor is connected to the gate of the pull-down transistor, and the difference between the second low level and the third low level is larger than the critical voltage of the pull-down transistor.

Optionally, the pull-down unit further comprises a third pull-down control transistor, the gate of the third pull-down control transistor is connected to the first clock signal input terminal, the source of the third pull-down control transistor is connected to the third low level output terminal, and the drain of the third pull-down control transistor is connected to the source of the second pull-down control transistor.

Optionally, at least one of the driving transistor, the output pull-down transistor, the first switch transistor, the second switch transistor, the pull-down transistor, the first pull-down control transistor, the second pull-down control transistor and the third pull-down control transistor is a depletion transistor.

As another aspect of embodiments of the present disclosure, there is provided a shift register. The shift register comprises multiple stages of shift register units, wherein the shift register units are the above shift register units provided by embodiments of the present disclosure, and the driving signal input terminal of the shift register unit in next stage is connected to the driving signal output terminal of the shift register unit in the previous stage.

As a further aspect of embodiments of the present disclosure, there is provided a display apparatus, wherein the display apparatus comprises the above shift register provided by embodiments of the present disclosure.

In the shift register unit provided by embodiments of the present disclosure, the second clock signal input terminal is used to connect to the gate of the output pull-down transistor, and the source of the output pull-down transistor is connected to the first low level input terminal which can output the first low level. Since the low level input by the second clock signal input terminal during the evaluation phase is the second low level and the difference between the second low level and the first low level is larger than the critical voltage of the pull-down transistor, it is possible to use the second clock signal input terminal to directly control the pull-down transistor to be completely turned off during the evaluation phase. Because the difference between the second low level and the first low level is larger than the critical voltage of the pull-down transistor, the pull-down transistor can be completely turned off during the evaluation phase even if the pull-down transistor is a depletion transistor.

BRIEF DESCRIPTION OF THE DRAWINGS

The accompanying figures are used to provide further understanding of embodiments of the present disclosure and constitute part of the specification. The figures are used to explain embodiments of the present disclosure together with the following specific implementations, but do not limit the present disclosure.

DETAILED DESCRIPTION

In the following, detailed description will be made on specific implementations of the present disclosure in connection with the figures. It should be understood that the specific implementations described herein are only for illustrating and explaining the present disclosure, but not for limiting the present disclosure.

Figure 1:
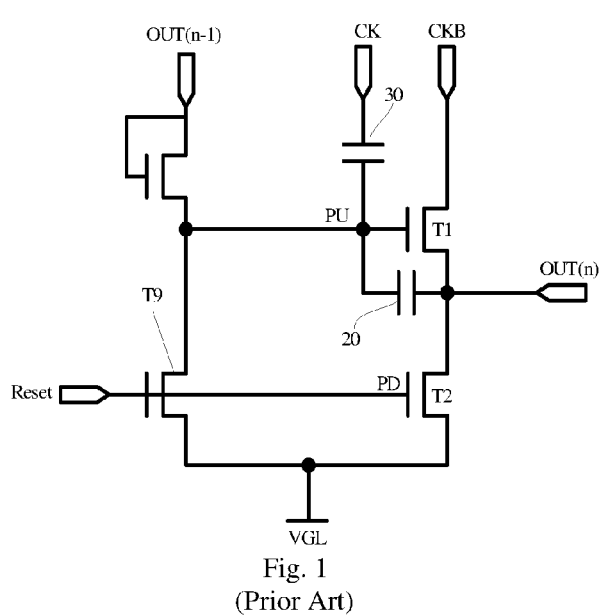
FIG. 1 is a circuit diagram of a known basic shift register unit.

FIG. 1 illustrates a circuit diagram of a known basic shift register unit. As shown in FIG. 1, the basic shift register unit comprises a driving transistor T1, an output pull-down transistor T2, a reset transistor T9, a bootstrap capacitor 20, a storage capacitor 30, a first clock signal input terminal CK, a second clock signal input terminal CKB, a driving signal input terminal OUT(n−1), a reset terminal Rest and a driving signal output terminal OUT(n).

Figure 2:
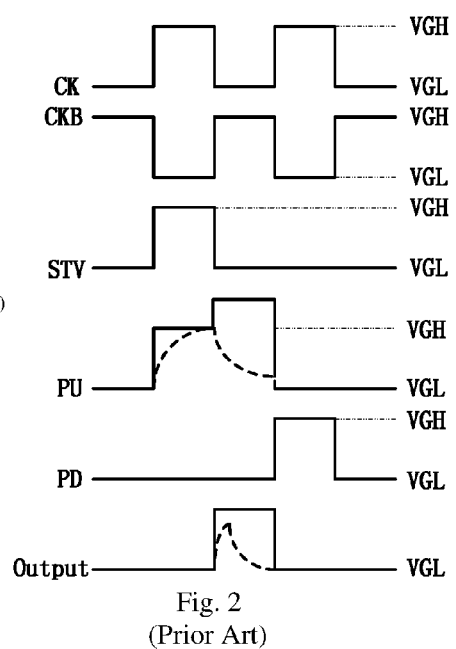
FIG. 2 is a time sequence diagram of various signals of the shift register unit shown in FIG. 1 during operation.

In FIG. 1, the pull-up node PU is a node connected to the gate of the driving transistor T1, and the pull-down node PD is a node connected to the gate of the output pull-down transistor T2. A starting signal STV is input from the driving signal input terminal OUT(n−1), and VGL is a low level. FIG. 2 illustrates a time sequence diagram of various signals of the shift register unit of FIG. 1 during operation, and VGH is a high level.

The thin film transistors (TFTs) fabricated by amorphous silicon (a-Si) and poly silicon (p-Si) are enhancement TFTs. When the enhancement TFT technology is used to fabricate the basic shift register unit circuit, the shift register unit shown in FIG. 1 can operate normally (as shown by the solid line part of FIG. 2).

Figure 3:
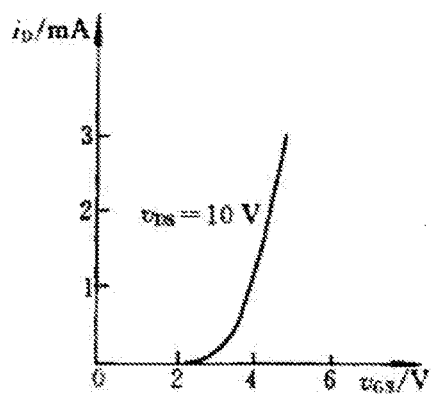
FIG. 3 is a characteristic curve chart of an enhancement transistor.
Figure 4:
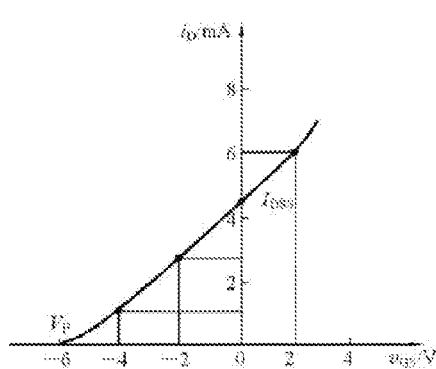
FIG. 4 is a characteristic curve chart of a depletion transistor.

In recent years, the oxide TFT as a very promising semiconductor technology is simpler and has lower cost than the p-Si process, and has larger mobility than a-Si; therefore, it draws more and more attention, and probably becomes the mainstream backplane driving technology of the OLED and flexible display in the future. However, the oxide TFT (whose difference with the enhancement TFT is shown in FIG. 3 and FIG. 4) has the characteristic of the depletion type. FIG. 3 is a characteristic curve chart of the enhancement TFT in which the ordinate is the current of the drain of the TFT and the abscissa is the gate-source voltage. It can be seen from the characteristic curve graph of the enhancement TFT shown in FIG. 3 that when the voltage Vgs (the gate-source voltage) is zero, id (drain current) is zero, in other words, when Vgs is zero, the enhancement TFT is completely turned off. It can be seen from the characteristic curve graph of the depletion TFT shown in FIG. 4 that the ordinate is also the current of the drain and the abscissa is also the gate-source voltage. However, FIG. 4 shows that when Vgs is zero, id is far larger than zero; only when the gate-source voltage is a certain negative voltage, id is zero.

As shown by the dashed line part of FIG. 2, when the depletion TFT is applied to the circuit shown in FIG. 1, it cannot operate normally.

Figure 5:
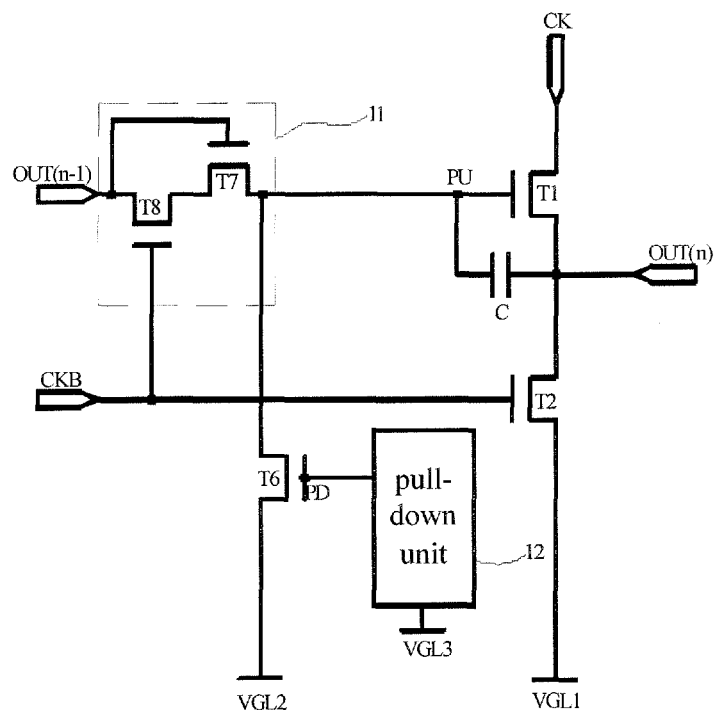
FIG. 5 is a circuit diagram of an implementation of a shift register unit provided by an embodiment of the present disclosure.
Figure 6:
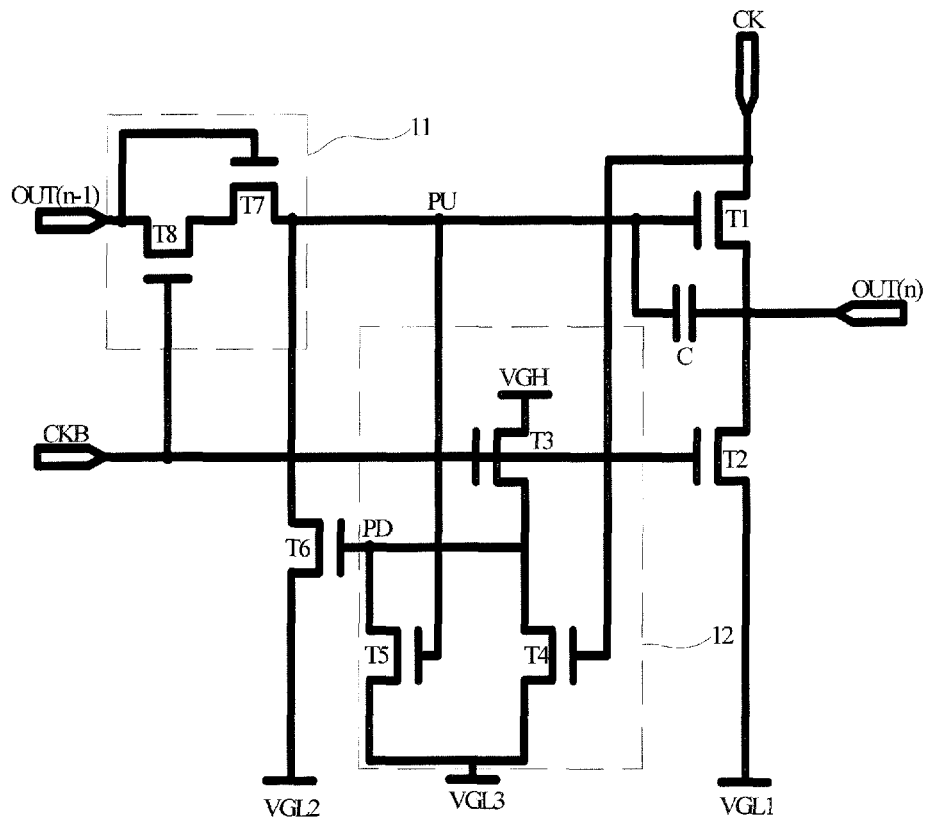
FIG. 6 is a circuit diagram of another implementation of a shift register unit provided by an embodiment of the present disclosure.

As shown in FIG. 5 and FIG. 6, as one aspect of embodiments of the present disclosure, there is provided a shift register unit. The shift register unit comprises a driving signal input terminal OUT(n−1), a driving signal output terminal OUT(n), a first clock signal input terminal CK, a second clock signal input terminal CKB, a driving transistor T1 and an output pull-down transistor T2, wherein the gate of the output pull-down transistor T2 is connected to the second clock signal input terminal CKB, the low level input by the driving signal input terminal OUT(n−1) is a first low level VGL1, the source of the output pull-down transistor T2 is connected to a first low level output terminal (the first low level output terminal can output the first low level VGL1 to the source of the output pull-down transistor T2), the low levels input by the first clock signal input terminal CK and the second clock signal input terminal CKB both are a second low level VGL2, and the difference between the first low level VGL1 and the second low level VGL2 is larger than the absolute value of the critical voltage (i.e., threshold voltage) of the output pull-down transistor T2 (i.e., VGL1−VGL2>|Vtht2|) such that the pull-down transistor T2 can be turned off during an evaluation phase.

Figure 7:
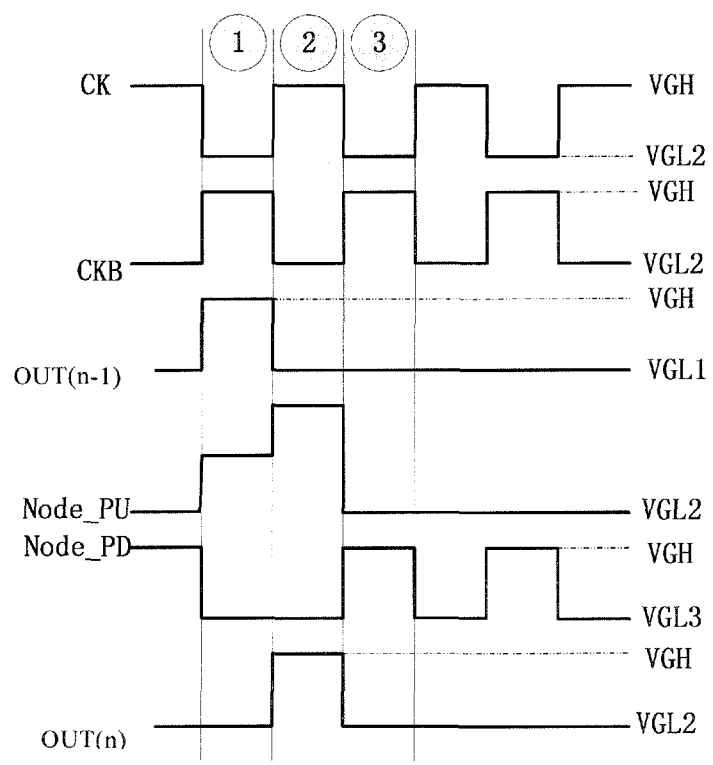
FIG. 7 is a time sequence diagram of various signals of the shift register unit shown in FIG. 6 during operation.

It should be understood that, in an embodiment of the present disclosure, as shown in FIG. 7, the high level signal input from the driving signal input terminal OUT(n−1) is a high level VGH, and the low level signal input from the driving signal input terminal OUT(n−1) is the first low level VGL1; the high level first clock signal input from the first clock signal input terminal CK is the high level VGH, and the low level input from the first clock signal input terminal CK is the low level VGL2; the high level input from the second clock signal input terminal CKB is VGH, and the low level input from the second clock signal input terminal CKB is the second low level VGL2.

In an embodiment of the present disclosure, because the second clock signal input terminal CKB is directly connected to the gate of the output pull-down transistor T2, it is possible to use the second clock signal input from the second clock signal input terminal CKB to directly control the output pull-down transistor T2 to turn on and turn off.

In the evaluation phase of the shift register unit (i.e., phase ② in FIG. 7), the first clock signal input by the first clock signal input terminal CK is the high level VGH, the second clock signal input by the second clock signal input terminal CKB is the second low level VGL2, the signal input by the driving signal input terminal OUT(n−1) is the first low level VGL1, the gate level of the output pull-down transistor T2 is the second low level VGL2, and the source level of the output pull-down transistor T2 is the first low level VGL1. Because VGL1−VGL2>|VthT2|, in the evaluation phase, the output pull-down transistor T2 can be turned off normally even if the output pull-down transistor T2 is a depletion transistor, and no electricity leakage would occur.

Normally, the node connected to the gate of the driving transistor T1 is referred to as the pull-up node (that is, the gate of the driving transistor T1 forms the pull-up node PU), and the electrical potential of the pull-up node PU is the same as the electric potential of the gate of the driving transistor T1.

In order to ensure that the shift register unit provided by embodiments of the present disclosure can output a square wave with sufficient pulse width, optionally, as shown in FIG. 5 and FIG. 6, the shift register unit can further comprise a switch unit 11 connected to the pull-up node PU, the switch unit 11 can connect the pull-up node PU with the driving signal input terminal OUT(n−1) during a pre-charging phase (i.e., phase ① in FIG. 7) to charge a capacitor C connected to the driving transistor T1 in parallel, and the switch unit 11 can disconnect the pull-up node PU from the driving signal input terminal OUT(n−1) during the evaluation phase (i.e., phase ② in FIG. 7) to prevent the pull-up node PU from leaking electricity.

In the pre-charging phase, the switch unit 11 connects the pull-up node PU with the driving signal input terminal OUT(n−1) such that the driving signal input terminal OUT(n−1) can normally charge the capacitor C to rapidly raise the voltage of the pull-up node PU. In the evaluation phase, the second clock signal input terminal CLB inputs the second low level VGL2 to turn off the output pull-down transistor T2, the first clock signal input terminal CK inputs the high level VGH which, through the driving transistor T1, couples the pull-up node PU to a high electrical potential via the capacitor C, and the switch unit 11 disconnects the pull-up node PU from the driving signal input terminal OUT(n−1) to prevent the pull-up node PU from leaking electricity. Therefore, an output signal with sufficient pulse width can be obtained at the driving signal output terminal OUT(n).

In embodiments of the present disclosure, the switch unit 11 can have various forms as long as in the pre-charging phase the switch unit 11 can connect the pull-up node PU with the driving signal input terminal OUT(n−1) to charge the capacitor C connected with driving transistor T1 in parallel and in the evaluation phase the switch unit 11 can disconnect the pull-up node PU from the driving signal input terminal OUT(n−1) to prevent the pull-up node PU from leaking electricity.

As an optional implementation of the present disclosure, as shown in FIG. 5 and FIG. 6, the switch unit 11 can comprise a first switch transistor T8 and a second switch transistor T7, the gate of the first switch transistor T8 is connected to the second clock signal input terminal CKB, the drain of the first switch transistor T8 is connected to the driving signal input terminal OUT(n−1), the source of the first switch transistor T8 is connected to the drain of the second switch transistor T7, the gate of the second switch transistor T7 is connected to the driving signal input terminal OUT(n−1), and the source of the second switch transistor T7 is connected to the pull-up node PU.

In the pre-charging phase (i.e., phase ① in FIG. 7), the signal input by the driving signal input terminal OUTPUT (n−1) is the high level VGH, and the first clock signal input by the first clock signal input terminal CK is the second low level VGL2, the second clock signal input by the second clock signal input terminal CKB is the high level VGH. Because the gate of the first switch transistor T8 is connected to the second clock signal input terminal CKB and the gate of the second switch transistor T7 is connected to the driving signal input terminal OUT(n−1), the first switch transistor T8 and the second switch transistor T7 are both turned on, and the driving signal input terminal OUT(n−1) can charge the capacitor C through the first switch transistor T8 and the second switch transistor T7 such that the voltage at the pull-up node PU increases rapidly.

In the evaluation phase (i.e., phase ② in FIG. 7), the signal input by the driving signal input terminal OUT(n−1) is the first low level VGL1 and the second clock signal input by the second clock signal input terminal CLK is the second low level VGL2; therefore, the first switch transistor T8 and the second switch transistor T7 are both turned off. Since the first switch transistor T8 and the second switch transistor T7 are turned off, the first clock signal input by the first clock signal input terminal CK is the high level VGH. At this time, the first clock signal can coupe the electrical potential of the pull-up node PU to a relatively high level through the capacitor C without leaking electricity.

It is noted that, if the first switch transistor T8 and the second switch transistor T7 are depletion transistors, the difference between the first low level VGL and the second low level VGL2 is larger than the absolute value of the critical voltage of the first switch transistor T8 (i.e., VGL1−VGL2>|VthT2|) to ensure the first switch transistor T8 can be normally turned off in the evaluation phase.

In order to make the signal output by the shift register unit more stable, optionally, the shift register unit can comprise a pull-down unit 12 and a pull-down transistor T6, the gate of the pull-down transistor T6 is connected to the pull-down unit 12, the source of the pull-down transistor T6 is connected to a second low level output terminal (the second low level output terminal can output the second low level VGL2 to the source of the pull-down transistor T6), and the pull-down unit 12 can turn off the pull-down transistor T6 during the evaluation phase (i.e., phase ② in FIG. 7) and turn on the pull-down transistor T6 during a reset phase (i.e., phase ③ in FIG. 7) and a non-operation phase (i.e., the part on the right of phase ③ in FIG. 7) such that the pull-down transistor T6 can pull down the level of the pull-up node PU to the second low level during the reset phase and the non-operation phase.

In the evaluation phase, the pull-down transistor T6 is turned off to prevent the pull-up node PU from leaking electricity. In the reset phase and the non-operation phase, the pull-down transistor T6 is turned on to discharge the pull-up node PU such that it can be ensured that the driving signal output terminal OUT(n) outputs a low level in the reset phase and the non-operation phase.

In embodiments of the present disclosure, there is no special requirement on the specific structure of the pull-down unit 12 as long as the pull-down transistor T6 can be turned off in the evaluation phase and turned on in the reset phase and the non-operation phase.

As an optional implementation of the present disclosure, as shown in FIG. 6, the pull-down unit 12 comprises a first pull-down control transistor T5 and a second pull-down control transistor T3, the gate of the first pull-down control transistor T5 is connected to the pull-up node PU, the source of the first pull-down control transistor T5 is connected to a third low level output terminal (the third low level output terminal can output a third low level VGL3 to the source of the first pull-down control transistor T5), the drain of the first pull-down control transistor T5 is connected to the gate of the pull-down transistor T6, the gate of the second pull-down control transistor T3 is connected to the second clock signal input terminal CKB, the drain of the second pull-down control transistor T3 is connected to a high level output terminal (the high output terminal can output the high level VGH to the drain of the second pull-down control transistor T3), the source of the second pull-down control transistor T3 is connected to the gate of the pull-down transistor T6, and the difference between the second low level VGL2 and the third low level VGL3 is larger than the critical voltage of the pull-down transistor T6 (i.e., VGL2−VGL3>|VthT6|).

In the evaluation phase, the signal input by the driving signal input terminal OUT(n−1) is the first low level VGL1, the second clock signal input by the second clock signal input terminal CKB jumps to the second low level VGL2, and the first clock signal input by the first clock signal input terminal CK jumps to the high level VGH. The output pull-down transistor T2 is turned off. Because the pull-up node PU is coupled to a relatively high level, the first pull-down control transistor T5 is turned on and the second pull-down control transistor T3 is turned off such that the gate voltage of the pull-down transistor T6 is pulled down to the third low level VGL3 to completely turn off the pull-down transistor T6.

In embodiments of the present disclosure, the gate of the pull-down transistor T6 can be referred to the pull-down node PD. In an embodiment of the present disclosure, since the second clock signal input terminal CKB directly controls the output pull-down transistor T2, the pull-down node PD has no influence on the driving signal output terminal OUT(n).

In the reset phase, the second clock signal input by the second clock signal input terminal CKB jumps to the high level VGH, the driving signal input terminal OUT(n−1) remains the first low level VGL1, and the first clock signal input by the first clock signal input terminal CK jumps to the second low level VGL2. The output pull-down transistor T2 is turned on, the driving signal output terminal OUT(n) is pulled down to the first low level VGL1, and the voltage jump of the driving signal output terminal OUT(n) pulls the electrical potential of the pull-up node PU rapidly down to a potential lower than that in the evaluation phase through the coupling effect of the capacitor C. Of course, this lower potential is still sufficient for the driving transistor T1 to turn on, but the first clock signal input by the first clock signal input terminal CK at this time is the second low level VGL2 which has no pull-up effect on the driving signal output terminal OUT(n). Since the electrical potential of the pull-up node PU drops, the gate potential of the first pull-down control transistor T5 also drops. However, the first pull-down control transistor T5 is still in an ON state to some extent, but the passing current in such an ON state is relatively small and has a weak pull-down effect on the pull-down node PD. The gate of the second pull-down control transistor T3 is at the high level VGH input by the second clock signal input terminal CKB; therefore, the second pull-down control transistor T3 is completely turned on. Although the first pull-down control transistor T5 is not turned off, its pull-down effect is weak; therefore, the pull-down node PD can still be pulled up to be turned on by the high level passing the second pull-down control transistor T3, so that the pull-down transistor T6 is turned on to rapidly pull down the electrical potential of the pull-up node PU. The rapid pulling down of the electrical potential of the pull-down node PD will then further turn off the first pull-down control transistor T5. Such an interaction will make the electrical potential of the pull-up node PU drop faster such that the driving transistor T1 causes the electrical potential of the pull-up node PU to drop to the second low level VGL 2 before the next high level of the first clock signal input terminal CK is input; thereby, the driving transistor T1 is completely turned off.

In the non-operation phase, for the pull-down node PD, in addition to the pull-up level controlled by the second clock signal input terminal CKB, there is a pull-down level controlled by the first clock signal input terminal CK. Only in terms of functionality, in the non-operation phase of the shift register unit, the pulling down of the pull-down node PD is meaningless. The pull-down level employed herein enhances the pulling down capability in the operation phase to rapidly turn off the pull-down transistor T6. In addition, another function is to enable the gate of the pull-down transistor T6 (i.e., the pull-down node PD) to be in an alternate voltage state to avoid long-time DC bias voltage causing the transfer curve of the pull-down transistor T6 to shift to the right and thus avoid its aging and failure. Therefore, the usage lifetime of the entire shift register unit can be improved.

In order to ensure that the pull-down transistor T6 can be turned off faster in the evaluation phase, for example, the pull-down unit 12 can further comprise a third pull-down control transistor T4, the gate of the third pull-down control transistor T4 is connected to the first clock signal input terminal CK, the source of the third pull-down control transistor T4 is connected to the third low level output terminal, and the drain of the third pull-down control transistor T4 is connected to the source of the second pull-down control transistor T3.

In the shift register unit described in an embodiment of the present disclosure, at least one of the driving transistor T1, the output pull-down transistor T2, the first switch transistor T8, the second switch transistor T7, the pull-down transistor T6, the first pull-down control transistor T5, the second pull-down control transistor T3 and the third pull-down control transistor T4 is a depletion transistor.

In the following, with reference to the specific implementation in FIG. 6, the operation principle of the transistors is described when the driving transistor T1, the output pull-down transistor T2, the first switch transistor T8, the second switch transistor T7, the pull-down transistor T6, the first pull-down control transistor T5, the second pull-down control transistor T3 and the third pull-down control transistor T4 are all depletion transistors, and the critical voltages of the above transistors are equal. Optionally, the driving transistor T1, the output pull-down transistor T2, the first switch transistor T8, the second switch transistor T7, the pull-down transistor T6, the first pull-down control transistor T5, the second pull-down control transistor T3 and the third pull-down control transistor T4 are all oxide transistors.

In the pre-charging phase (i.e., phase ① in FIG. 7), the second clock signal input by the second clock signal input terminal CKB and the signal input by the driving signal input terminal OUT(n−1) are the high level VGH, and the first clock signal input by the first clock signal input terminal CK is the second low level VGL2; therefore, the output pull-down transistor T2, the second pull-down control transistor T3, the second switch transistor T7 and the first switch transistor T8 are turned on.

Because the source voltage of the third pull-down control transistor T4 is the third low level VGL3 but the gate voltage of the third pull-down control transistor T4 is the second low level VGL2 input by the first clock signal input terminal CK, the third pull-down control transistor T4 is not completely turned off but has some leakage of electricity.

The second switch transistor T7 and the first switch transistor T8 are turned on, the driving signal input terminal OUT(n−1) charges the capacitor C through the second switch transistor T7 and the first switch transistor T8, and the voltage of the pull-up node PU raises rapidly to turn on the first pull-down control transistor T5. Although the second pull-down control transistor T3 is also turned on such that the high level VGH input by the high level input terminal has some pulling up effect on the pull-down node PD, the electricity leakage of the third pull-down control transistor T4 and the turning on of the first pull-down control transistor T5 would rapidly make the electrical potential of the pull-down node PD pulled down by the third low level VGL3.

Although the gate potential of the pull-down transistor T6 does not completely drop to the third low level VGL3 to completely turn off the pull-down transistor T6 due to the joint effect of the second pull-down control transistor T3, the third pull-down control transistor T4 and the first pull-down control transistor T5, the leakage current of the pull-down transistor T6 will be decreased dramatically such that the electrical potential of the pull-up node PU will not be pulled down too much; therefore, in the pre-charging phase, the driving transistor T1 can still obtain sufficient turning-on electrical potential. As a result, in the pre-charging phase, the driving signal output terminal OUT(n) will be pulled down by the low level of the first clock signal input by the first clock signal input terminal CK, while the turning on of the output pull-down transistor T2 will also pull down the electrical potential of the output terminal OUT(n).

In the evaluation phase (i.e., phase ② in FIG. 7), the signal input by the driving signal input terminal OUT(n−1) is the first low level VGL1, the second clock signal input by the second clock signal input terminal CKB jumps to the second low level VGL2, and the first clock signal input by the first clock signal input terminal CK jumps to the high level VGH.

The source of the output pull-down transistor T2 is the first low level VGL1, and the gate of the output pull-down transistor T2 is the second low level VGL2 input by the second clock signal input terminal CKB; therefore, the output pull-down transistor T2 is turned off. The source potential of the first switch transistor T8 is the first low level VGL1 input by the driving signal input terminal OUT(n−1) while the gate potential of the first switch transistor T8 is the second clock signal of the second clock signal input terminal CKB (i.e., the second low level VGL2); therefore, the first switch transistor T8 is turned. Although the second clock signal input by the second clock signal input terminal CKB is the second low level VGL 2, the second pull-down control transistor T3 is not completely turned off but has small leakage current passing through.

Since the first clock signal (high level VGH) output by the first clock signal input terminal CK couples the electrical potential of the pull-up node PU to a relatively high level through the capacitor C after passing through the driving transistor T1, the first pull-down control transistor T5 is sufficiently turned on while the third pull-down control transistor T4 is also turned on. Although the second pull-down control transistor T3 is not completely turned off, the electrical potential of the pull-down node PD will still be pulled down to the third low level VGL3; therefore, the pull-down transistor T6 is completely turned off, which further creates a condition for the pull-up node PU to preserve the high level. The sufficient turning on of the driving transistor T1 makes the driving signal output terminal OUT(n) output the high level VGH.

In the reset phase (i.e., phase ③ in FIG. 7), the second clock signal input by the second clock signal input terminal CKB jumps to the high level VGH, and the signal input by the driving signal input terminal OUT(n−1) remains the first low level VGL1. The first clock signal input by the first clock signal input terminal CK is the second low level VGL2. Therefore, the output pull-down transistor T2, the second pull-down control transistor T3, the second switch transistor T7 and the first switch transistor T8 are turned on.

Since the source level of the third pull-down control transistor T4 is the third low level VGL3 while the gate level of the third pull-down control transistor T4 is the first clock signal (i.e., the second low level VGL2) input by the first clock signal input terminal CK, the third pull-down control transistor T4 is not completely turned off but has some leakage of electricity. Due to the turning on of the output pull-down transistor T2, the driving signal output terminal OUT(n) is pulled down to the first low level VGL1, the voltage jump of the driving signal output terminal OUT(n) rapidly pulls the electrical potential of the pull-up node PU down to a lower electrical potential than that in the evaluation phase by the coupling effect of the capacitor C. Of course, this lower electrical potential is still sufficient to turn on the driving transistor T1, but the first clock signal input terminal CK at this time is also at a low potential which has no pulling up effect on the driving signal output terminal OUT(n).

Due to the potential drop of the pull-up node PU, the gate potential of the first pull-down control transistor T5 drops accordingly. However, the first pull-down control transistor T5 is still in an ON state to some extent, but the passing current in such an ON state is relatively small and has weak pull-down effect on the pull-down node PD. Due to the high level VGH of the second clock signal input terminal CKB, the second pull-down control transistor T3 is completely turned on. Although the first pull-down control transistor T5 is not turned off, its pulling down effect is weakened; therefore, the pull-down node PD can still be pulled up to be turned on by the high level passing the second pull-down control transistor T3, so that the pull-down transistor T6 is turned on to rapidly pull down the electrical potential of the pull-up node PU. The rapid pulling down of the electrical potential of the pull-down node PD will then further turn off the first pull-down control transistor T5. Such an interaction will make the electrical potential of the pull-up node PU drop faster such that the driving transistor T1 causes the electrical potential of the pull-up node PU to drop to the second low level VGL 2 before the next high level of the first clock signal input terminal CK is input; thereby, the driving transistor T1 is completely turned off.

The shift register unit shown in FIG. 6 uses three different types of low levels (the first low level VGL1, the second low level VGL2 and the third low level VGL3), which can make the gate-source voltage of the output pull-down transistor T2 be negative such that the output pull-down transistor T2 is completely turned off in the evaluation phase. In addition, the shift register unit can well maintain the electrical potential of the pull-up node PU to completely turn off the driving transistor T1 in the non-operation phase; therefore, it is possible to output a signal with required pulse width and required voltage.

As another aspect of embodiments of the present disclosure, there is provided a shift register. The shift register comprises multiple stages of shift register units, wherein the shift register units are the above shift register units provided by embodiments of the present disclosure, and the driving signal input terminal of the shift register unit in next stage is connected to the driving signal output terminal of the shift register unit in the previous stage. In embodiments of the present disclosure, n is a positive integer.

As a further aspect of embodiments of the present disclosure, there is provided a display apparatus, wherein the display apparatus comprises the above shift register provided by embodiments of the present disclosure. The display apparatus can comprise a liquid crystal display apparatus, such as a liquid crystal panel, a liquid crystal TV set, a cell phone, a liquid crystal display, and so on. In addition to the liquid crystal display apparatus, the display apparatus can also comprise an organic light emitting display or other types of display apparatuses such as an electronic reader. The shift register can be used as a scan circuit, a gate driving circuit or the like of the display apparatus to provide line-by-line scan function and transfer scan signals to the display area.

It can be understood that the above implementations are only exemplary implementations adopted for illustrating the principle of the present disclosure, but the present disclosure is not limited to that. Those skilled in the art can make various variations and improvements without departing from the spirit and essence of the present disclosure. These variations and improvements are also intended to be incorporated within the protection scope of the present disclosure.

What is claimed is:

1. A shift register unit, comprising
a driving signal input terminal, a driving signal output terminal, a first clock signal input terminal, a second clock signal input terminal, a driving transistor and an output pull-down transistor, wherein
the gate of the output pull-down transistor is connected to the second clock signal input terminal, a low level input by the driving signal input terminal is a first low level, the source of the output pull-down transistor is connected to a first low level output terminal, the low levels input by the first clock signal input terminal and the second clock signal input terminal both are a second low level, and the difference between the first low level and the second low level is larger than the absolute value of the critical voltage of the output pull-down transistor such that the pull-down transistor is turned off during an evaluation phase,
wherein the gate of the driving transistor forms a pull-up node, the shift register unit further comprises a switch unit connected to the pull-up node, the switch unit connects the pull-up node with the driving signal input terminal during a pre-charging phase to charge an external capacitor connected to the driving transistor in parallel so as to raise the voltage of the pull-up node to a first high level, the external capacitor connected between a gate and a source of the driving transistor, and during the evaluation phase, the first clock signal input terminal inputs the high level which, through the driving transistor, couples the pull-up node to a second high level via the external capacitor, and the switch unit disconnects the pull-up node from the driving signal input terminal during the evaluation phase to prevent the pull-up node from leaking electricity,
wherein the switch unit comprises a first switch transistor and a second switch transistor, the gate of the first switch transistor is connected to the second clock signal input terminal, the drain of the first switch transistor is connected to the driving signal input terminal, the source of the first switch transistor is connected to the drain of the second switch transistor, the gate of the second switch transistor is connected to the driving signal input terminal, and the source of the second switch transistor is connected to the pull-up node, during the evaluation phase, the gate of the first switch transistor receives the second low level input by the second clock signal input terminal, and the drain of the first switch transistor receives the first low level input by the driving signal input terminal, the difference between the first low level and the second low level is larger than the absolute value of the critical voltage of the output pull-down transistor to ensure the first switch transistor is turned off during the evaluation phase.

2. The shift register unit according to claim 1, wherein the shift register unit comprises a pull-down unit and a pull-down transistor, the gate of the pull-down transistor is connected to the pull-down unit, the source of the pull-down transistor is connected to a second low level output terminal, and the pull-down unit turns off the pull-down transistor during the evaluation phase and turn on the pull-down transistor during a reset phase and a non-operation phase such that the pull-down transistor pulls down the level of the pull-up node to the second low level during the reset phase and the non-operation phase.

3. The shift register unit according to claim 2, wherein the pull-down unit comprises a first pull-down control transistor and a second pull-down control transistor, the gate of the first pull-down control transistor is connected to the pull-up node, the source of the first pull-down control transistor is connected to a third low level output terminal, the drain of the first pull-down control transistor is connected to the gate of the pull-down transistor, the gate of the second pull-down control transistor is connected to the second clock signal input terminal, the drain of the second pull-down control transistor is connected to a high level output terminal, the source of the second pull-down control transistor is connected to the gate of the pull-down transistor, and the difference between the second low level and the third low level is larger than the critical voltage of the pull-down transistor.

4. The shift register unit according to claim 3, wherein the pull-down unit further comprises a third pull-down control transistor, the gate of the third pull-down control transistor is connected to the first clock signal input terminal, the source of the third pull-down control transistor is connected to the third low level output terminal, and the drain of the third pull-down control transistor is connected to the source of the second pull-down control transistor.

5. The shift register unit according to claim 4, wherein at least one of the driving transistor, the output pull-down transistor, the pull-down transistor, the first pull-down control transistor, the second pull-down control transistor and the third pull-down control transistor is a depletion transistor.

6. A shift register comprising multiple stages of shift register units, wherein the shift register units are shift register units according to claim 1, and the driving signal input terminal of the shift register unit in next stage is connected to the driving signal output terminal of the shift register unit in the previous stage.

7. A display apparatus comprising a shift register according to claim 6.

8. A shift register comprising multiple stages of shift register units, wherein the shift register units are shift register units according to claim 2, and the driving signal input terminal of the shift register unit in next stage is connected to the driving signal output terminal of the shift register unit in the previous stage.

9. A display apparatus comprising a shift register according to claim 8.

* * * * *